United States Patent [19]
Kamiguchi et al.

[11] Patent Number: 6,111,729
[45] Date of Patent: *Aug. 29, 2000

[54] MAGNETORESISTANCE EFFECT ELEMENT

[75] Inventors: Yuzo Kamiguchi, Yokohama; Akiko Saito, Kawasaki; Kazuhiro Saito, Yokohama; Hideaki Fukuzawa, Sagamihara; Hitoshi Iwasaki, Yokosuka; Masashi Sahashi, Yokohama, all of Japan

[73] Assignee: Kabushiki Kaisha Toshiba, Kawasaki, Japan

[*] Notice: This patent is subject to a terminal disclaimer.

[21] Appl. No.: 09/313,767

[22] Filed: May 18, 1999

Related U.S. Application Data

[63] Continuation of application No. 08/848,262, Apr. 29, 1997, Pat. No. 5,949,622.

[30] Foreign Application Priority Data

Apr. 30, 1996 [JP] Japan ................ 8-109068

[51] Int. Cl.$^7$ ................................ G11B 5/39
[52] U.S. Cl. ............................... 360/324.1
[58] Field of Search .............. 360/113; 338/32 R; 324/207.21, 252

[56] References Cited

U.S. PATENT DOCUMENTS

| | | | |
|---|---|---|---|
| 5,287,238 | 2/1994 | Baumgart et al. | 360/113 |
| 5,549,978 | 8/1996 | Iwasaki et al. | 428/692 |
| 5,627,703 | 5/1997 | Smith | 360/113 |
| 5,648,885 | 7/1997 | Nishioka et al. | 360/113 |

FOREIGN PATENT DOCUMENTS

| | | |
|---|---|---|
| 0 613 148 | 8/1994 | European Pat. Off. |
| 0 677 750 | 10/1995 | European Pat. Off. |

OTHER PUBLICATIONS

Kamiguchi et al., "Giant magnetoresistance and soft magnetic properties of $Co_{90}Fe_{10}$/Cu spin–value structures," J. Applied Phys. (1996), 79:6399–6401.

Dieny et al., "Giant magnetoresistance of magnetically soft sandwiches: Dependence on temperature and on layer thickness," The American Physical Society (1992), 45:806–813.

Dieny et al., Magnetotransport properties of magnetically soft spin–valve structures (invited), J. Appl. Phys. (1991), 69:4774–79.

Parkin et al., "Oscillations in Exchange Coupling and Magnetoresistance in Metallic Superlattice Structures: Co/Ru, Co/Cr, and Fe/Cr," The American Physical Society (1990), 64:2304–07.

Baibich et al., "Giant Magnetoresistance of (001) Fe/ (001) Cr Magnetic Superlattices," The American Physical Society (1988), 61:2472–75.

Hunt, "A Magnetoresistance Readout Transducer," IEEE Transactions on Magnetics (1971), MAG–7:150–154.

*Primary Examiner*—George J. Letscher
*Attorney, Agent, or Firm*—Finnegan, Henderson, Farabow, Garrett & Dunner, L.L.P.

[57] ABSTRACT

A magnetoresistance effect element provided with a spin valve film composed of a first magnetic layer formed on a metallic buffer layer, a middle non-magnetic layer formed on the first magnetic layer, and a second magnetic layer formed on the non-magnetic layer, has an atomic-diffusion barrier layer whose average thickness is 2 nm or less formed in the interface between the metallic buffer layer and the first magnetic layer. Or a magnetoresistance effect element provided with a spin valve film composed of a first magnetic layer composed of a laminated film of a magnetic undercoat layer and a ferromagnetic layer, a middle non-magnetic layer formed on the first magnetic layer, and a second magnetic layer formed on the middle non-magnetic layer, has an atomic-diffusion barrier layer whose average thickness is 2 nm or less formed in the interface between the magnetic undercoat layer and the ferromagnetic layer.

45 Claims, 1 Drawing Sheet

MAGNETORESISTANCE EFFECT ELEMENT

This is a continuation of application Ser. No. 08/848,262, filed Apr. 29, 1997, now U.S. Pat. No. 5,949,622. The contents of this application being relied upon and incorporated by reference herein.

BACKGROUND OF THE INVENTION

1. Field of the Invention

The present invention relates to a magnetoresistance effect element using a spin valve film.

2. Description of the Related Art

In general, information recorded on a magnetic recording medium has been read out by a method of detecting a voltage induced in a coil by electromagnetic induction caused by moving a reproducing magnetic head having the coil relatively to the recording medium. On the other hand, it has been known also to use a magnetoresistance effect element (hereinafter referred to as an MR element) in case of reading out information (refer to IEEE MAG-7,150 (1971) and the like). A magnetic head using an MR element (hereinafter referred to as an MR head) utilizes a phenomenon that electric resistance of a ferromagnetic material of some kind varies according to intensity of an external magnetic field.

In recent years, since making a magnetic recording medium smaller in size and greater in capacity has been promoted and a relative velocity between a reproducing magnetic head and a magnetic recording medium when reading out information has been smaller, people's expectation on an MR head which can take out a great output also in a small relative velocity has been increased.

Hereupon, an Ni—Fe alloy, what is called a Permalloy-system alloy has been used in a portion varying in resistance by sensing a magnetic field outside an MR head (hereinafter referred to as an MR element). However, even if a Permalloy-system alloy is an alloy having a good soft-magnetic property, it is at most 3% in magnetoresistance change ratio and therefore it is insufficient in magnetoresistance change ratio as an MR element to be used for a magnetic recording medium which has been made small in size and large in capacity. Accordingly, a magnetoresistance effect material of higher sensitivity has been desired as an MR element material.

In order to meet such a demand, it has been confirmed that a multilayered film where a ferromagnetic metallic film and a non-magnetic metallic film are alternately stacked under a certain condition and where the ferromagnetic metallic films near each other are coupled by antiferromagnetic coupling, what is called an artificial lattice film shows a huge magnetoresistance effect. It has been reported that an artificial lattice film shows a great magnetoresistance change ratio of more than 100% at the maximum (see "Phys. Rev. Lett., Vol.61,2474 (1988), "Phys. Rev. Lett., Vol.64,2304 (1990), and the like). However, since an artificial lattice film has a high saturation magnetic field, it is unsuitable for an MR element.

On the other hand, an example has been reported that a multilayered film of a sandwich structure of a ferromagnetic film/a non-magnetic film/a ferromagnetic film in which the ferromagnetic films are not coupled by antiferromagnetic coupling has also attained a great magnetoresistance effect. Namely, one of the two ferromagnetic films having a non-magnetic film interposed between them is fixedly magnetized by applying an exchange bias to it and the other ferromagnetic film is rotated in magnetization by an external magnetic field (a signal magnetic field or the like). In this way, a great magnetoresistance effect can be obtained by changing a relative angle made between the magnetized directions of the two ferromagnetic films disposed so as to have a non-magnetic film interposed between them. A multilayered film of such a type is called a spin valve film (see "Phys. Rev. B., Vol.45,806 (1992), "J. Appl. Phys., Vol.69, 4774 (1991), and the like). Although a spin valve film has a smaller magnetoresistance change ratio in comparison with an artificial lattice film, it is suitable for an MR element thanks to that it can saturate magnetization in a low magnetic field. A great expectation in practical use is placed on an MR head using such a spin valve film.

By the way, in an MR element using the above-mentioned spin valve film, it is said to be important to improve a soft magnetic property of the ferromagnetic film by improving its crystal orientation. For example, in a spin valve film using a Co-based ferromagnetic material such as Co or a Co-based alloy as a ferromagnetic layer, to form a Co-based ferromagnetic layer directly on an amorphous material lowers its crystal orientation and deteriorates its soft magnetic property. Thereupon, it has been studied to improve the crystal orientation by forming a metallic film having an fcc crystal structure as a buffer layer and forming a Co-based ferromagnetic layer on this metallic buffer layer.

However, in case of using a soft magnetic material such as an NiFe alloy or the like as the above-mentioned metallic buffer layer, thermal diffusion easily happens between the soft magnetic material and the Co-based ferromagnetic material, and the magnetoresistance effect is deteriorated. And although it has been studied also to form a ferromagnetic layer to rotate magnetization by an external magnetic field on a magnetic undercoat layer composed of various soft magnetic materials, in such a case also, the magnetoresistance effect is deteriorated due to thermal diffusion which happens between the ferromagnetic layer and the magnetic undercoat layer.

Since a heat treatment is indispensable in a process of manufacturing an MR element using a spin valve film, the above-mentioned deterioration of the magnetoresistance effect caused by thermal diffusion is a serious problem. In such a way, an MR element having a conventional spin valve film has a problem that it is poor in thermal stability (heat resistance), and it has been a great problem to improve the thermal stability by suppressing the thermal diffusion.

SUMMARY OF THE INVENTION

The present invention has been performed for the purpose of coping with such a problem, and an object of the invention is to provide a high-performance magnetoresistance effect element which is excellent in thermal stability by suppressing the thermal diffusion.

A first magnetoresistance effect element of the invention is a magnetoresistance effect element provided with a spin valve film having a first magnetic layer formed on a metallic buffer layer, a second magnetic layer, and a middle non-magnetic layer interposed between the first and second magnetic layers, wherein an atomic-diffusion barrier layer having an average thickness of 2 nm or less is formed in the interface between said metallic buffer layer and the first magnetic layer.

The first magnetoresistance effect element is furthermore a magnetoresistance effect element provided with a spin valve film having a first magnetic layer composed of a ferromagnetic material containing Co which has been formed on a metallic buffer layer having an fcc crystal structure, a second magnetic layer, and a middle non-magnetic layer interposed between the first and second magnetic layers, wherein an atomic-diffusion barrier layer having as the main component at least one kind of material selected from an oxide, a nitride, a carbide, a boride, and a fluoride is formed between said metallic buffer layer and the first magnetic layer.

A second magnetoresistance effect element of the invention is a magnetoresistance effect element provided with a spin valve film having a first magnetic layer composed of a laminated film of a magnetic undercoat layer and a ferromagnetic layer, a second magnetic layer, and a middle non-magnetic layer interposed between the first and second magnetic layers, wherein an atomic-diffusion barrier layer having an average thickness of 2 nm or less is formed in the interface between said magnetic undercoat layer and the erromagnetic layer.

The second magnetoresistance effect element is furthermore a magnetoresistance effect element provided with a spin valve film having a first magnetic layer composed of a laminated film of a magnetic undercoat layer and a ferromagnetic layer containing Co, a second magnetic layer, and a middle non-magnetic layer interposed between the first and second magnetic layers, wherein an atomic-diffusion barrier layer having as the main component at least one kind of material selected from an oxide, a nitride, a carbide, a boride, and a fluoride is formed in the interface between the magnetic undercoat layer and the ferromagnetic layer.

In the first magnetoresistance effect element, since an atomic-diffusion barrier layer as described above is provided in the interface between the metallic buffer layer and the first magnetic layer, it is possible to preferably suppress atomic cross-diffusion between the metallic buffer layer and the first magnetic layer in heat treatment and to obtain an effect of improving the first magnetic layer in film quality by the metallic buffer layer. Therefore, it is possible to stably obtain a good magnetoresistance effect after heat treatment and at the same time it is possible to obtain a good soft magnetic property.

And in the second magnetoresistance effect element, since an atomic-diffusion barrier layer as described above is provided in the interface between the magnetic undercoat layer and the ferromagnetic layer, in the same way it is possible to preferably suppress atomic cross-diffusion between the magnetic undercoat layer and the ferromagnetic layer in heat treatment. Therefore, it is possible to stably obtain a good magnetoresistance effect after heat treatment.

DETAILED DESCRIPTION OF THE PREFERRED EMBODIMENTS

Embodiments of the invention are described in the following.

First, an embodiment of the first magnetoresistance effect element (MR element) of the invention is described.

Figure 1:
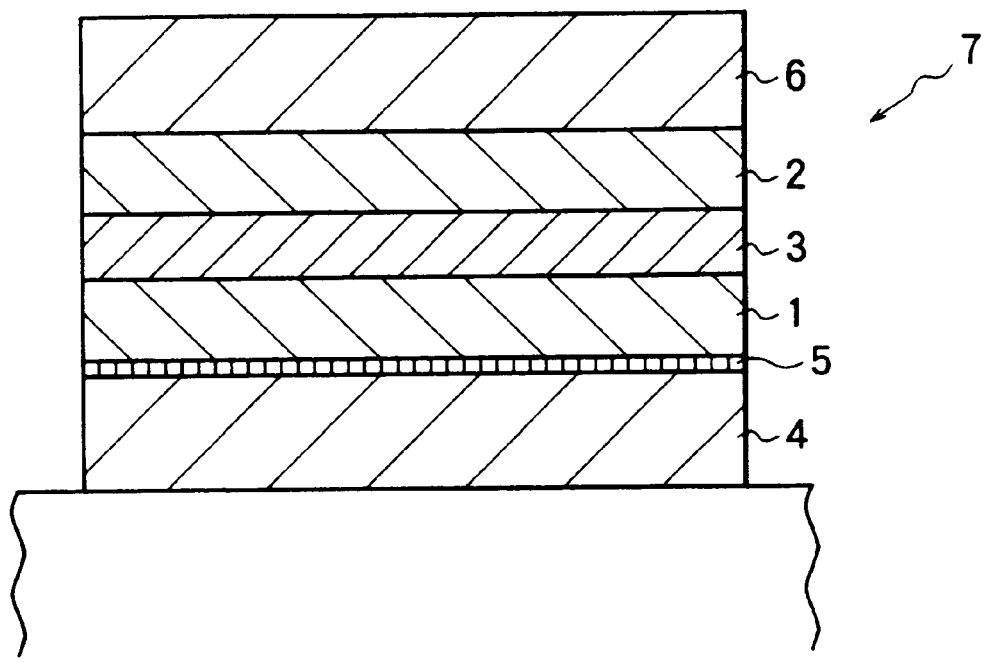
FIG. 1 is a sectional view for showing the structure of the main part of an embodiment of the first embodiment of the invention.

FIG. 1 is a sectional view for showing the composition of the main part of an embodiment of the first MR element. In FIG. 1, reference number 1 is a first magnetic layer, number 2 is a second magnetic layer, and a middle non-magnetic layer 3 is interposed between the first magnetic layer 1 and the second magnetic layer 2. These magnetic, layers 1 and 2 form a laminated film of a non-coupled type without being coupled with each other by antiferromagnetic coupling.

Each of the first magnetic layer 1 and the second magnetic layer 2 is composed of such a ferromagnetic material containing Co as Co alone or a Co-based magnetic alloy, or such a ferromagnetic material as an NiFe alloy or the like. Among them, as a ferromagnetic material containing Co, it is preferable to use a Co-based magnetic alloy which can make great an interfacial effect as well as Barkhausen effect having particularly a great influence upon the MR change ratio and can bring a great MR change ratio thanks to this.

As such a Co-based magnetic alloy as described above, an alloy obtained by adding one or two or more of Fe, Ni, Au, Ag, Cu, Pd, Pt, Ir, Rh, Ru, Os, Hf, and the like to Co is mentioned. An amount of elements to be added is preferably 5 to 50 atom %, and more preferably in a range of 8 to 20 atom %. The reason is that when the amount of added elements is too little, the Barkhausen effect is not sufficiently increased, and conversely when the amount of added elements is too much, there is a possibility that the interfacial effect is remarkably decreased. As an additive element, particularly, it is preferable to use Fe in order to obtain a great MR change ratio.

And it is preferable that the first magnetic layer 1 and the second magnetic layer 2 have a thickness of 1 to 30 nm which can give a great KR change ratio and can suppress occurrence of Barkhausen noises.

The first magnetic layer 1 of the above-mentioned magnetic layers 1 and 2 is formed on a metallic buffer layer 4, and thanks to this, the first magnetic layer 1 is improved in film quality by improvement of its crystal orientation. In case of using a ferromagnetic material containing Co as described above for the first magnetic layer 1, as the metallic buffer layer 4, a metallic material having an fcc crystal structure such as an NiFe alloy, an NiFeCo alloy, an alloy whose resistance is made higher by adding such an additive element as Ti, V, Cr, Mn, Zn, Nb, Mo, Tc, Hf, Ta, W, Re or the like to these alloy of an fcc crystal structure can be mentioned. Among them, an NiFe alloy, an NiFeCo alloy or the like functions also as a magnetic undercoat layer as described later. And in case of using a ferromagnetic material such as an NiFe alloy or the like as the first magnetic layer 1, Ta, Ti, Cr, Cu, Au and Ag, and an alloy of them and the like can be used as the metallic buffer layer 4. The first magnetic layer 1 is a magnetic layer whose magnetization is rotated by an external magnetic field such as a signal magnetic field, what is called a free magnetic layer.

And an atomic-diffusion barrier layer 5 is formed in the interface between the first magnetic layer 1 and the metallic buffer layer 4, and this suppresses thermal diffusion of atoms between the first magnetic layer 1 and the metallic buffer layer 4 in heat treatment. That is to say, by forming the atomic-diffusion barrier layer 5, it is possible to suppress deterioration of the magnetoresistance effect caused by thermal diffusion and to improve an MR element in thermal stability. Although the atomic-diffusion barrier layer 5 needs to be thermally stable and suppress atomic cross-diffusion between the first magnetic layer 1 and the metallic buffer layer 4, since when it is too thick the metallic buffer layer 4 cannot bring an effect of improvement in film quality, it is desirable to make it as thin as possible within a range where a bad influence does not happen upon an effect of suppressing the atomic cross-diffusion. Accordingly, the average thickness of the atomic-diffusion barrier layer 5 is set at 2 nm or less. However, since a function as an atomic-diffusion barrier is deteriorated when it is too thin, it is preferable that its average thickness is 0.5 nm or more.

As a material for the atomic-diffusion barrier layer 5, a thermally stable material such as an oxide, a nitride, a carbide, a boride, a fluoride and the like can be used, and they can be used not only in the form of a single material alone but also in the form of a mixture, a composite compound, or the like. Among them, a self-oxide film, a surface-oxide film, a passive film and the like which are particularly easy to form and excellent in suppression of atomic diffusion are preferably used. The atomic-diffusion barrier layer 5 composed of such compounds can be formed by forming a metallic buffer layer 4 and then once exposing its surface to the air or an atmosphere containing oxygen, nitrogen, carbon, boron, fluorine or the like. And it can be also formed by using an ion injection method or exposing it to plasma or the like.

A compound forming the atomic-diffusion barrier layer 5 does not have to have a stoichiometrically accurate composition and does not have to have a neat crystal lattice, and may be in an amorphous state. Furthermore, the atomic-diffusion barrier layer 5 does not have to uniformly cover the surface of the metallic buffer layer 4 but may cover it in a discontinuous state such as a state where pinholes are formed or where an oxide, a nitride, a cabide, a boride, a fluoride or the like is formed in the shape of islands. It is more preferable that there are pinholes to such a degree that they may not have a bad influence upon an effect of suppressing atomic cross-diffusion. The reason is that there is a possibility that an effect of improvement in film quality and a magnetic coupling are reduced. Considering the above points, it is preferable that the average size of pinholes is nearly equal to or less than the distance between pinholes adjacent to each other.

On the other hand, the second magnetic layer 2, whose magnetization is fixed as being given a bias magnetic field by an antiferromagnetic layer 6 composed of an IrMn film, an FeMn film, an NiO film or the like, or a hard magnetic layer composed of a CoPt film or the like, is what is called a pin magnetic layer. The second magnetic layer 2 as a pin magnetic layer is not limited to a layer obtained by fixing magnetization of the ferromagnetic layer by means of an antiferromagnetic layer 6 or the like as described above but can be directly composed of a hard magnetic layer for example.

Here, it is preferable to keep the magnetizing directions of the first magnetic layer 1 and the second magnetic layer 2, for example, perpendicular to each other in a state where the external magnetic field is zero in order to improve an MR element in linear response. Such a magnetized state can be obtained by applying an annealing process shown in the following, for example. That is to say, (1) after keeping a sample at a temperature of about 523K as applying a magnetic field of about 1 kOe to the sample, (2) the process cools the sample to a temperature of about 483K in a magnetic field of about 1 kOe as it is, and (3) turns the direction of the applied magnetic field by 90° when the temperature has reached about 483K and cools the sample to the room temperature. An orthogonally magnetized state can be stably obtained by such an annealing process (hereinafter referred to as an orthogonal annealing process). As for magnetizing directions, it is preferable that magnetization of the first magnetic layer 1 is in the track-width direction and magnetization of the second magnetic layer 2 is in the vertical direction to the medium facing surface perpendicular to the magnetizing direction of the first magnetic layer 1.

And an annealing process to be applied to the first magnetic layer 1 and the second magnetic layer 2 is not limited to the above-mentioned orthogonal annealing process but is also performed in order to improve the first magnetic layer 1 and the second magnetic layer 2 in crystallinity. In this case, the annealing process is performed at a temperature of about 100 to 400K for a time of about 1 minute to 10 hours.

The middle non-magnetic layer 3 disposed between the said magnetic layers 1 and 2 is composed of a paramagnetic material, a diamagnetic material, an antiferromagnetic material, a spin glass material, or the like. For example, Cu, Au, Ag, a paramagnetic alloy containing them and a magnetic element, Pd, Pt, and an alloy containing them as its main ingredient are mentioned. Here, it is preferable to set the thickness of the middle non-magnetic layer 3 in a range of about 2 to 5 nm. The middle non-magnetic layer 3 cannot give a sufficient resistance change sensitivity when its thickness is more than 5 nm, and it is difficult to make small enough the exchange coupling between the magnetic layers 1 and 2 when its thickness is less than 2 nm.

The spin valve laminated film 7 is composed of the above-mentioned layers, and in an MR element provided with such a spin valve laminated film 7, since the magnetizing direction of the first magnetic layer 1 is rotated by an external magnetic field while the magnetizing direction of the second magnetic layer 2 is fixed, a magnetoresistance effect is obtained by that the relative angle between the magnetizing directions of the two magnetic layers 1 and 2 which are disposed so as to have the middle non-magnetic layer 3 interposed between them is changed.

In an MR element of said embodiment, since an atomic-diffusion barrier layer 5 composed of an oxide, a nitride, a carbide, a boride, a fluoride or the like is formed in the interface between the first magnetic layer 1 and the metallic buffer layer 4, it is possible to stably suppress atomic cross-diffusion between the first magnetic layer 1 and the metallic buffer layer 4 when applying an orthogonal annealing process as described above or an annealing process for improvement of crystallinity. And an effect of improvement in film quality by the metallic buffer layer 4 can be sufficiently obtained by making the average thickness of the atomic-diffusion barrier layer 5 be 2 nm or less. In such a way, according to an MR element of said embodiment, since an effect of improvement in film quality by the metallic buffer layer 4 can be sufficiently obtained and deterioration of a magnetoresistance effect caused by thermal diffusion can be suppressed, it is possible to attain a high performance and furthermore improve a thermal stability.

Next, an embodiment for implementing the second magnetoresistance effect element (MR element) of the invention is described in the following.

Figure 2:
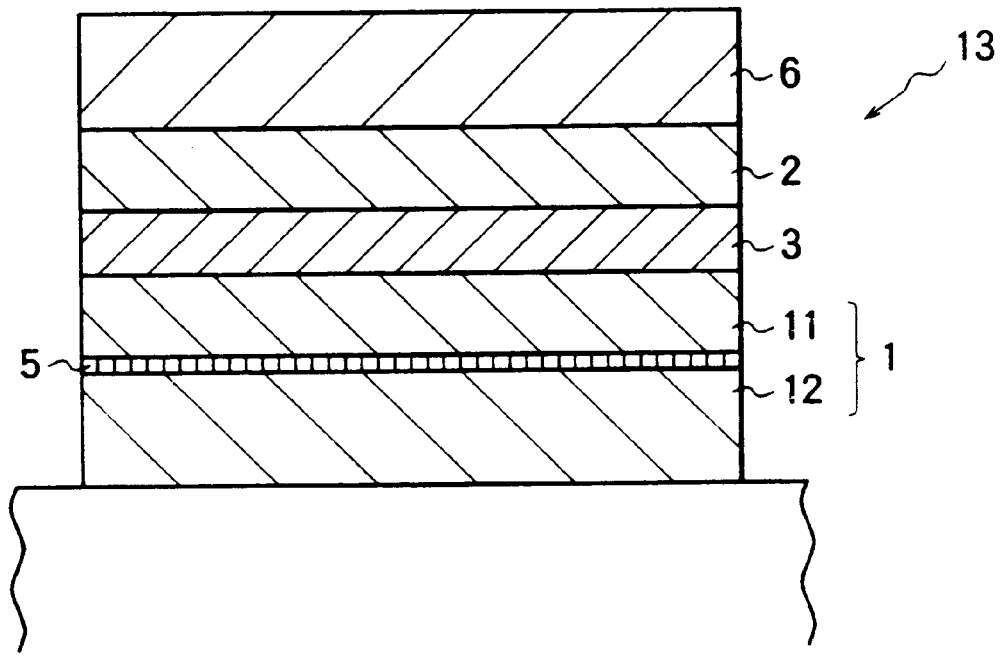
FIG. 2 is a sectional view for showing the structure of the main part of an embodiment of the second embodiment of the invention.

FIG. 2 is a sectional view for showing composition of the main part of an embodiment of the second MR element. In FIG. 2, reference number 1 is a first magnetic layer, number 2 is a second magnetic layer, and a middle non-magnetic layer 3 is interposed between these first and second magnetic layers 1 and 2. These magnetic layers 1 and 2 form a laminated film of a non-coupling type without being coupled by an antiferromagnetic coupling.

The first magnetic layer 1 of these magnetic layers 1 and 2 is composed of a laminated film of a ferromagnetic layer 11 composed of a ferromagnetic material as described in the first embodiment and a magnetic undercoat layer 12 composed of various soft magnetic materials. Among them the ferromagnetic layer 11 is a layer to contribute to a magnetoresistance effect and the magnetic undercoat layer 12 is a layer to improve the ferromagnetic layer 11 in soft magnetic property.

Here, since among said ferromagnetic materials, particularly it is difficult for such ferromagnetic materials containing Co as Co or a Co-based alloy to attain a good soft-magnetic property by themselves alone, they are materials for which a magnetic undercoat layer 12 is desirably formed in particular.

The magnetic undercoat layer 12 may be composed of a soft magnetic material film composed of one kind of soft magnetic material and may be composed of a soft magnetic material laminated film composed of two or more kinds of soft magnetic materials. As a component material for the magnetic undercoat layer 12, an NiFe alloy, an NiFeCo alloy, an alloy whose resistance is made higher by adding such an additive element as Ti, V, Cr, Mn, Zn, Nb, Mo, Tc, Hf, Ta, W, Re or the like to these soft magnetic alloys, an alloy made amorphous by adding the same additive elements as described above to Co, for example, an amorphous CoNbZr alloy and the like can be mentioned.

The first magnetic layer 1 composed of a laminated film of the ferromagnetic layer 11 and a magnetic undercoat layer 12 is arranged so that the ferromagnetic layer 11 may be in contact with the middle non-magnetic layer 3. Although it is not always limited to this arrangement, such an arrangement as described above is desirable in order to obtain a great MR change ratio. And it is desirable to make directly magnetically an exchange coupling between the ferromagnetic layer 11 and the magnetic undercoat layer 12 and make them act as one body in magnetization when seen in the film thickness direction. This first magnetic layer 1 is a magnetic layer whose magnetization is rotated by an external magnetic field such as a signal magnetic field or the like, what is called a free magnetic layer.

And an atomic-diffusion barrier layer 5 is formed in the interface between the ferromagnetic layer 11 and the magnetic undercoat layer 12, and this suppresses thermal diffusion between the ferromagnetic layer 11 and the magnetic undercoat layer 12 in heat treatment. That is to say, by forming an atomic-diffusion barrier layer 5, it is possible to suppress deterioration of a magnetoresistance effect caused by thermal diffusion and an MR element is improved in thermal stability. Although the atomic-diffusion barrier layer 5 needs to be thermally stable and suppress an atomic cross-diffusion between the ferromagnetic layer 11 and the magnetic undercoat layer 12, since a magnetic coupling between the ferromagnetic layer 11 and the magnetic undercoat layer 12 is cut off when it is too thick, it is desirable to make it as thin as possible within a range where a bad influence does not happen upon an effect of suppressing an atomic cross-diffusion. Therefore, the average thickness of the atomic-diffusion barrier layer 5 is set at 2 nm or less. However, since a function as an atomic-diffusion barrier is deteriorated when it is too thin, it is preferable that the average thickness of the atomic-diffusion barrier layer 5 is 0.5 nm or more.

A material for the atomic-diffusion barrier layer 5 is the same as described in the first embodiment and in the same way as the first embodiment, a self-oxide film, a surface oxide film, a passive film and the like which are particularly easy to form and excellent in suppression of atomic diffusion are preferably used. A method for forming such an atomic-diffusion barrier layer 5 is also the same as described in the first embodiment.

A compound forming the atomic-diffusion barrier layer 5 does not have to have a stoichiometrically accurate composition and does not have to have a neat crystal lattice, but may be in an amorphous state. Furthermore, the atomic-diffusion barrier layer 5 does not have to uniformly cover the surface of the metallic buffer layer 4 but may cover it in a discontinuous state such as a state where pinholes are formed or where an oxide, a nitride, a cabide, a boride, a fluoride or the like is formed in the shape of islands. It is possible to obtain a better effect of improvement in film quality of the ferromagnetic layer 11 and a better magnetic coupling of the first magnetic layer 1 by forming it in a discontinuous state than by forming it in a continuous state.

Particularly, in order to keep sufficiently a magnetic coupling between the ferromagnetic layer 11 and the magnetic undercoat layer 12, it is preferable to positively reduce the area covered with a compound as described above and form the atomic-diffusion barrier layer 5 in a discontinuous state.

And in order to keep sufficiently a magnetic coupling between the ferromagnetic layer 11 and the magnetic undercoat layer 12, it is preferable also to form the atomic-diffusion barrier layer 5 out of a ferromagnetic material or an antiferromagnetic material. As a ferromagnetic material for forming the atomic-diffusion barrier layer 5, spinel ferrite, FexN and the like are mentioned, and as an antiferromagnetic material for forming the atomic-diffusion barrier layer 5, NiO, MnxN, CoO and the like are mentioned.

The second magnetic layer 2 is what is called a pin magnetic layer whose magnetization is fixed by applying a bias magnetic field by means of an antiferromagnetic layer 6 or a hard magnetic layer in the same way as said first embodiment. The second magnetic layer 2 and the antiferromagnetic layer 6 are composed in the same way as said first embodiment, and the middle non-magnetic layer 3 is also the same as the first embodiment.

An orthogonal annealing process or an annealing process for improvement in crystallinity is applied to the first magnetic layer 1 and the second magnetic layer 2 in the same way as the said first embodiment. Annealing conditions of these are the same as described in the first embodiment.

A spin valve laminated film 13 is composed of the above-mentioned layers, and in an MR element provided with such a spin valve laminated film 13, since the magnetizing direction of the first magnetic layer 1 is rotated by an external magnetic field while the magnetizing direction of the second magnetic layer 2 is fixed, a magnetoresistance effect is obtained by that the relative angle between the magnetizing directions of the two magnetic layers 1 and 2 which are disposed so as to have the middle non-magnetic layer 3 interposed between them is changed.

In an MR element of the embodiment, since an atomic-diffusion barrier layer 5 composed of an oxide, a nitride, a carbide, a boride, a fluoride or the like is formed in the interface between the first magnetic layer 11 and the magnetic undercoat layer 12, it is possible to stably suppress atomic cross-diffusion between the first magnetic layer 11 and the magnetic undercoat layer 12 when applying an orthogonal annealing process as described above or an annealing process for improvement in crystallinity. And a good effect of giving a soft magnetic property to the ferromagnetic layer 11 by means of the magnetic undercoat layer 12 can be obtained, since a magnetic coupling between the ferromagnetic layer 11 and the magnetic undercoat layer 12 is not deteriorated. According to an MR element of the above embodiment, since an effect of giving a soft magnetic property to the ferromagnetic layer 11 by means of the magnetic undercoat layer 12 can be sufficiently obtained and deterioration of a magnetoresistance effect caused by thermal diffusion can be suppressed, it is possible to attain a high performance and furthermore improve a thermal stability.

(Embodiments)

Next, concrete embodiments of the present invention are described in the following.

(Embodiment 1)

First, as the magnetic undercoat layer 12, an amorphous CoNbZr alloy film of 10 nm in thickness and an NiFe alloy film of 2 nm in thickness were formed one after another on a thermally oxidized Si substrate by means of a sputtering method. Here, the NiFe alloy film acts also as a metallic buffer layer 4.

After said NiFe alloy film was formed, the surface of it was once exposed to the air, and a passive film was formed as an atomic-diffusion barrier layer on the NiFe alloy film. Examining the state of this passive film by means of a sectional TEM, the average thickness of it was about 1 nm and its formed state was discontinuous in the shape of islands.

Next, a spin valve laminated film 13 (7) was made by forming one after another a $Co_{90}Fe_{10}$ alloy film of 3 nm in thickness as a ferromagnetic layer 11, a Cu film of 3 nm in thickness as a middle non-magnetic layer 3, a $Co_{90}Fe_{10}$ alloy film of 3 nm in thickness as a second magnetic layer 2, an IrMn alloy film of 10 nm in thickness as an antiferromagnetic layer 6, and a Ta film of 5 nm in thickness as a protective layer on the NiFe alloy film on whose surface a passive film had been formed.

On the other hand, as a comparative example 1 to be compared with the present invention, a spin valve laminated film was made in the same way as the embodiment 1 except that all the films were consecutively formed inside a vacuum chamber without exposing the surface of the NiFe alloy film after it was formed. In the spin valve laminated film of the comparative example, an atomic-diffusion barrier layer is not formed in the interface between the NiFe alloy film and the $Co_{90}Fe_{10}$ alloy film.

The respective spin valve laminated films according to the embodiment 1 and comparative example 1 were patterned and then annealed at 523K. The MR change ratios of the respective MR elements obtained in such a way were measured. The MR change ratios were measured respectively after annealing of 2 hours, after annealing of 10 hours, after annealing of 50 hours, and after annealing of 100 hours, and from the result of these measurements the MR element according to the embodiment and the MR element according to the comparative example were compared with each other in thermal stability. Table 1 shows the result of measurement of the MR change ratios after the lapse of the respective annealing hours.

TABLE 1

| Annealing time (hours) | MR change ratio (%) | | | | |
|---|---|---|---|---|---|
| | 0 (as depo) | 2 | 10 | 50 | 100 |
| Embodiment 1 | 6.2 | 8.0 | 8.0 | 8.0 | 8.0 |
| Comparative example 1 | 6.9 | 6.1 | 5.9 | 5.4 | 4.9 |

As known from Table 1, in the comparative example having no atomic-diffusion barrier layer formed in the interface between the NiFe alloy film and the $Co_{90}Fe_{10}$ alloy film due to the consecutive film forming, although the MR change ratio immediately after the film forming is as comparatively good as 6.9%, the MR change ratio is abruptly decreased after annealing of 2 hours. And after that, the MR change ratio continues to decrease with the lapse of annealing time and the MR change ratio has decreased to 4.9% after annealing of 100 hours. The reason is thought that since there is not a barrier layer to suppress atomic diffusion in the interface between the NiFe alloy film and the $Co_{90}Fe_{10}$ alloy film, atomic cross-diffusion has progressed between the layers due to the annealing, and the MR change ratio has been decreased by this. In such a way, the MR element of the comparative example 1 was poor in thermal stability (heat resistance).

On the other hand, in the embodiment 1 having an atomic-diffusion barrier layer formed in the interface between the NiFe alloy film and the $Co_{90}Fe_{10}$ alloy film by exposing once the NiFe alloy film to the air after forming it, although the MR change ratio immediately after the film forming was lower than the comparative example, the MR change ratio rised to 8.0% after annealing of 2 hours. The reason is thought that the 2-hour annealing process improved the respective layers in crystallinity and the atomic-diffusion barrier layer suppressed atomic diffusion in the interface between the NiFe alloy film and the $Co_{90}Fe_{10}$ alloy film. It is known that the MR change ratio is not decreased from 8.0% and atomic diffusion in the interface between the NiFe alloy film and the $Co_{90}Fe_{10}$ alloy film is suppressed even after annealing for a furthermore long time. In such a way, the MR element of the embodiment 1 was excellent in thermal stability (heat resistance).

(Embodiment 2)

First, as the magnetic undercoat layer 12, an amorphous CoNbZr alloy film of 10 nm in thickness and an NiFe alloy film of 2 nm in thickness were formed one after another on a thermally oxidized Si substrate by means of a plasma method.

Here, the NiFe alloy film acts also as a metallic buffer layer 4.

After the NiFe alloy film was formed, the plasma was once extinguished and an argon gas having 20% oxygen mixed in it was introduced into a vacuum chamber, and an oxide film was formed as an atomic-diffusion barrier layer on the surface of the NiFe alloy film. At this time, the surface oxide film was changed in thickness by controlling the time and pressure of introducing the mixed gas of oxygen and argon. The average thicknesses of the obtained surface oxide films were as shown in the following Table 2. The comparative example 2 in the table has a surface oxide film having a thickness outside the scope of the present invention.

TABLE 2

| | Sample number | Average thickness of a surface oxide film (nm) |
|---|---|---|
| Embodiment 2 | 1 | 0.3 |
| | 2 | 0.5 |
| | 3 | 1.0 |
| Comparative example 2 | 4 | 3.0 |

Thickness of a surface oxide film shown in Table 2 is an average thickness, and the oxide film having that thickness is not always uniformly formed. Thereupon, sample No.1 of the embodiment 2 whose surface oxide film has an average thickness of 0.3 nm has comparatively many pinholes in the surface oxide film.

Next, a spin valve laminated film 13 (7) was made by forming one after another a $Co_{90}Fe_{10}$ alloy film of 3 nm in thickness as a ferromagnetic layer 11, a Cu film of 3 nm in thickness as a middle non-magnetic layer 3, a $Co_{90}Fe_{10}$ alloy film of 2 nm in thickness as a second magnetic layer 2, an IrMn alloy film of 8 nm in thickness an. antiferromagnetic layer 6, and a Ta film of 5 nm in thickness as a protective film on the NiFe alloy film on whose surface an oxide film (passive film) had been formed.

The respective spin valve laminated films according to the embodiment 2 and comparative example 2 were patterned and then annealed at 523K for 2 hours. The MR change ratios of the respective MR elements obtained in such a way were measured, respectively, immediately after the film forming and after annealing of 2 hours. Table 3 shows the result of measurement of these.

TABLE 3

| | | MR change ratio (%) | |
|---|---|---|---|
| Sample number | Average thickness of a surface oxide film (nm) | Immediately after the film forming | After 2-hour annealing |
| Embodiment 2 | 1 | 0.3 | 5.8 | 6.2 |
| | 2 | 0.5 | 6.1 | 7.0 |
| | 3 | 1.0 | 6.0 | 8.2 |
| Comparative example 2 | 4 | 3.0 | 5.0 | 5.2 |

In any MR element according to the embodiment 2, its MR change ratio rised after annealing of 2 hours, and an effect of an atomic-diffusion barrier layer composed of a surface oxide film was confirmed. However, although in a sample whose surface oxide film is thin in thickness its MR change ratio did not rise so greatly and it is assumed that atomic cross-diffusion has happened in some degree, in a sample whose surface oxide film is 1 nm in thickness a good MR change ratio has been obtained.

On the other hand, in an MR element according to the comparative example 2, although its MR change ratio rised in some degree after annealing of 2 hours, the initial MR change ratio (immediately after the film forming) is small and as a result a sufficient MR change ratio has not been obtained. The reason is thought that an effect of the magnetic undercoat layer and the metallic buffer layer could not be obtained due to a too thick surface oxide film. And since a sufficient fcc orientation could not be obtained and a magnetic coupling with the magnetic undercoat layer was cut off, its soft magnetic property was deteriorated and its coercive force Hc was 3 Oe.

According to the invention as described above, since thermal diffusion between a metallic buffer layer and a magnetic layer or between a magnetic undercoat layer and a ferromagnetic layer can be suppressed, a magnetoresistance effect element which is high in performance and excellent in thermal stability can be provided.

In the magnetoresistance effect element of the present invention, a pair of lead electrodes which supply a sense current to the element are formed to be connected to the element. The structure of these lead electrodes and the connecting method thereof and the like can be realized by selecting any of known arts depending on the used magnetoresistance effect. For example, when the magnetoresistance effect element is used as a spin valve GMR element which mainly uses spin scattering at the interfaces between magnetic layers composed of a pinned layer and a free layer and nonmagnetic intermediate layer interposed between the pinned layer and the free layer, the lead electrodes are provided at the both side ends of the element to form electrical connections and thereby a sense current flows perpendicular to a surface of each layer. Or, for example, to flow a ferromagnetic tunnel current to the layer direction of each layer, the lead electrodes are provided at the upper surface and the lower surface of the element, or the lead electrodes are provide on either of the upper surface and the lower surface and on either of the both side ends of the element.

When the magnetoresistance effect element of the present invention is used as the spin valve GMR element, the lead electrodes may be formed by laminating with a hard magnetic film. This hard magnetic film can suppress the occurrence of magnetic domain in the free layer, and provides a longitudinal bias to the free layer. The above-mentioned longitudinal bias can be allowed by adjacently forming above the both side ends of at least the free layer of the magnetoresistance element. Further, it may be possible by laminating the hard magnetic film on the side ends of the free layer.

Further, the magnetoresistance effect element of the present invention as a GMR reproducing head can be unitarily formed with a magnetic recording head. The magnetic recording head has at least a pair of magnetic poles, a magnetic gap which separates the pair of magnetic poles at a plane facing the medium, and a coil for supplying an electric current field. The GMR head and the magnetic recording head are laminated on the substrate in order. In case of recording/reproducing separate type head, at least either of the pair of magnetic poles can be used as a magnetic sealed layer of the GMR head. Further, in case of recording/reproducing unit type head, a magnetic pole of the recording head can be used as a reproducing yoke of the GMR head. The magnetoresistance effect element of the present invention can be magnetically combined with the reproducing yoke.

These head structure can be realized by using the known arts.

What is claimed is:

1. A magnetoresistance effect element comprising:
   a metallic layer;
   a first ferromagnetic layer adjacent to the metallic layer;
   a non-magnetic layer disposed on the first ferromagnetic layer;
   a second ferromagnetic layer disposed on the non-magnetic layer so that the non-magnetic layer is disposed between the first and second ferromagnetic layer; and
   an insertion layer inserted between the first ferromagnetic layer and the metallic layer, and comprising at least one material selected from the group consisting of NiO, CoO, $Mn_xN$, $Fe_xN$, and iron oxide.

2. A magnetoresistance effect element according to claim 1, wherein the insertion layer has an average thickness in the range of 0.3 nm to 2 nm.

3. A magnetoresistance effect element according to claim 1, wherein the metallic layer is a non-magnetic layer.

4. A magnetoresistance effect element according to claim 1, wherein the metallic layer is a ferromagnetic layer.

5. A magnetoresistance effect element according to claim 1, wherein the iron oxide is ferrite.

6. A magnetoresistance effect element according to claim 1, wherein the iron oxide is spinel ferrite.

7. A magnetoresistance effect element according to claim 1, wherein the first ferromagnetic layer and the second ferromagnetic layer are magnetically non-coupled.

8. A magnetoresistance effect element according to claim 1, wherein the second ferromagnetic layer has fixed magnetization, and the first ferromagnetic layer is arranged to have magnetization perpendicular to the magnetization of the second ferromagnetic layer when an external magnetic field is zero.

9. A magnetoresistance effect element according to claim 1, wherein the metallic layer has the same crystal structure as the first ferromagnetic layer.

10. A magnetoresistance affect element comprising:
a metallic layer;
a first ferromagnetic layer adjacent to the metallic layer;
a non-magnetic layer disposed on the first ferromagnetic layer;
a second ferromagnetic layer disposed on the non-magnetic layer so that the non-magnetic layer is disposed between the first and second ferromagnetic layer; and
an insertion layer inserted between the first ferromagnetic layer and the metallic layer,
wherein the insertion layer comprises at least one selected from the group consisting of oxide, nitride, carbide, boride, and fluoride, formed in a continuous state.

11. A magnetoresistance effect element according to claim 10, wherein the insertion layer has an average thickness in the range of 0.3 nm to 2 nm.

12. A magnetoresistance effect element according to claim 10, wherein the metallic layer is a non-magnetic layer.

13. A magnetoresistance effect element according to claim 10, wherein the metallic layer is a ferromagnetic layer.

14. A magnetoresistance effect element according to claim 10, wherein the first ferromagnetic layer and the second ferromagnetic layer are magnetically non-coupled.

15. A magnetoresistance effect element according to claim 10, wherein the second ferromagnetic layer has fixed magnetization, and the first ferromagnetic layer is arranged to have magnetization perpendicular to the magnetization of the second ferromagnetic layer when an external magnetic field is zero.

16. A magnetoresistance effect element according to claim 10, wherein the metallic layer has the same crystal structure as the first ferromagnetic layer.

17. A magnetoresistance effect element comprising:
a metallic layer;
a first ferromagnetic layer adjacent to the metallic layer;
a non-magnetic layer disposed on the first ferromagnetic layer;
a second ferromagnetic layer disposed on the non-magnetic layer so that the non-magnetic, layer is disposed between the first and second ferromagnetic layers; and
an insertion layer inserted between the first ferromagnetic layer and the metallic layer, the insertion layer comprising a crystalline material of at least one selected from the group consisting of oxide, nitride, carbide, boride, and fluoride.

18. A magnetoresistance effect element according to claim 17, wherein the insertion layer has an average thickness in the range of 0.3 nm to 2 nm.

19. A magnetoresistance effect element according to claim 17, wherein the metallic layer is a non-magnetic layer.

20. A magnetoresistance effect element according to claim 17, wherein the metallic layer is a ferromagnetic layer.

21. A magnetoresistance effect element according to claim 17, wherein the first ferromagnetic layer and the second ferromagnetic layer are magnetically non-coupled.

22. A magnetoresistance effect element according to claim 17, wherein the second ferromagnetic layer has fixed magnetization, and the first ferromagnetic layer is arranged to have magnetization perpendicular to the magnetization of the second ferromagnetic layer when an external magnetic field is zero.

23. A magnetoresistance effect element according to claim 17, wherein the metallic layer has the same crystal structure as the first ferromagnetic layer.

24. A magnetoresistance effect element comprising:
a metallic layer;
a non-magnetic layer;
first and second ferromagnetic layers separated by the non-magnetic layer; and
an insertion layer of material selected from the group consisting of oxide, nitride, carbide, boride, and fluoride, the insertion layer being inserted between the first ferromagnetic layer and the metallic layer so that the first ferromagnetic layer is disposed between the non-magnetic layer and the insertion layer comprising at least one material selected from the group consisting of oxide, nitride, carbide, boride, and fluoride, the insertion layer having pinholes,
wherein the pinholes have an average size equal to or less than the distance between the pinholes adjacent to each other.

25. A magnetoresistance effect element according to claim 24, wherein the insertion layer has an average thickness in the range of 0.3 nm to 2 nm.

26. A magnetoresistance effect element according to claim 24, wherein the metallic layer is a non-magnetic layer.

27. A magnetoresistance effect element according to claim 24, wherein the metallic layer is a ferromagnetic layer.

28. A magnetoresistance effect element according to claim 24, wherein the first ferromagnetic layer and the second ferromagnetic layer are magnetically non-coupled.

29. A magnetoresistance effect element according to claim 24, wherein the second ferromagnetic layer has fixed magnetization, and the first ferromagnetic layer is arranged to have magnetization perpendicular to the magnetization of the second ferromagnetic layer when an external magnetic field is zero.

30. A magnetoresistance effect element according to claim 24, wherein the metallic layer has the same crystal structure as the first ferromagnetic layer.

31. A magnetoresistance effect element comprising:
a non-magnetic metallic layer;
a first ferromagnetic layer adjacent to the non-magnetic metallic layer;
a non-magnetic layer disposed on the first ferromagnetic layer;
a second ferromagnetic layer disposed on the non-magnetic layer so that the non-magnetic layer is disposed between the first and second ferromagnetic layers; and
an insertion layer inserted between the first ferromagnetic layer and the non-magnetic metallic layer, the insertion layer comprising at least one material selected from the group consisting of oxide, nitride, carbide, boride, and fluoride.

32. A magnetoresistance effect element according to claim 31, wherein the insertion layer has an average thickness in the range of 0.3 nm to 2 nm.

33. A magnetoresistance effect element according to claim 31, wherein the first ferromagnetic layer and the second ferromagnetic layer are magnetically non-coupled.

34. A magnetoresistance effect element according to claim 31, wherein the second ferromagnetic layer has fixed magnetization, and the first ferromagnetic layer is arranged to have magnetization perpendicular to the magnetization of the second ferromagnetic layer when an external magnetic field is zero.

35. A magnetoresistance effect element according to claim 31, wherein the non-magnetic metallic layer has the same crystal structure as the first ferromagnetic layer.

36. A magnetoresistance effect head comprising a magnetoresistance effect element and a pair of lead electrodes, the magnetoresistance effect film comprising:
 a metallic layer;
 a first ferromagnetic layer adjacent to the metallic layer;
 a non-magnetic layer disposed on the first ferromagnetic layer;
 a second ferromagnetic layer disposed on the non-magnetic layer so that the non-magnetic layer is disposed between the first and second ferromagnetic layers; and
 an insertion layer inserted between the first ferromagnetic layer and the metallic layer, and comprising at least one material selected from the group consisting of NiO, CoO, $Mn_xN$, $Fe_xN$, and iron oxide.

37. A magnetoresistance effect head comprising a magnetoresistance effect element and a pair of lead electrodes for supplying a sense current to the magnetoresistance effect element, the magnetoresistance effect element comprising:
 a metallic layer;
 a first ferromagnetic layer adjacent to the metallic layer;
 a non-magnetic layer disposed on the first ferromagnetic layer;
 a second ferromagnetic layer disposed on the non-magnetic layer so that the non-magnetic layer is disposed between the first and second ferromagnetic layers; and
 an insertion layer inserted between the first ferromagnetic layer and the metallic layer,
 wherein the insertion layer comprises at least one selected from the group consisting of oxide, nitride, carbide, boride, and fluoride, formed in a continuous state.

38. A magnetoresistance effect head comprising a magnetoresistance effect element and a pair of lead electrodes for supplying a sense current to the magnetoresistance effect element, the magnetoresistance effect element comprising:
 a metallic layer;
 a first ferromagnetic layer adjacent to the metallic layer;
 a non-magnetic layer disposed on the first ferromagnetic layer;
 a second ferromagnetic layer disposed on the non-magnetic layer so that the non-magnetic layer is disposed between the first and second ferromagnetic layers; and
 an insertion layer disposed between the first ferromagnetic layer and the metallic layer, the insertion layer comprising a crystalline material of at least one selected from the group consisting of oxide, nitride, carbide, boride, and fluoride.

39. A magnetoresistance effect head comprising a magnetoresistance effect element and a pair of lead electrodes for supplying a sense current to the magnetoresistance effect element, the magnetoresistance effect element comprising:
 a metallic layer;
 a non-magnetic layer;
 first and second ferromagnetic layers separated by the non-magnetic layer; and
 an insertion layer of material selected from the group consisting of oxide, nitride, carbide, boride, and fluoride, the insertion layer being inserted between the first ferromagnetic layer and the metallic layer so that the first ferromagnetic layer is disposed between the non-magnetic layer and the insertion layer comprising at least one material selected from the group consisting of oxide, nitride, carbide, boride, and fluoride, and the insertion layer having pinholes, and
 wherein the pinholes have an average size equal to or less than the distance between the pinholes adjacent to each other.

40. A magnetoresistance effect head comprising a magnetoresistance effect element and a pair of lead electrodes for supplying a sense current to the magnetoresistance effect element, the magnetoresistance effect element comprising:
 a non-magnetic metallic layer;
 a first ferromagnetic layer adjacent to the non-magnetic metallic layer;
 a non-magnetic layer disposed on the first ferromagnetic layer;
 a second ferromagnetic layer disposed on the non-magnetic layer so that the non-magnetic layer is disposed between the first and second ferromagnetic layers; and
 an insertion layer inserted between the first ferromagnetic layer and the non-magnetic metallic layer, the insertion layer comprising at least one material selected from the group consisting of oxide, nitride, carbide, boride, and fluoride.

41. A magnetic storage system comprising a magnetic medium and a magnetic reproducing head for reproducing magnetic signals from the magnetic medium, the magnetic reproducing head including a magnetoresistance effect element comprising:
 a metallic layer;
 a first ferromagnetic layer adjacent to the metallic layer;
 a non-magnetic layer disposed on the first ferromagnetic layer;
 a second ferromagnetic layer disposed on the non-magnetic layer so that the non-magnetic layer is disposed between the first and second ferromagnetic layers; and
 an insertion layer inserted between the first ferromagnetic layer and the metallic layer, and comprising at least one material selected from the group consisting of Nio, CoO, $Mn_xN$, $Fe_xN$, and iron oxide.

42. A magnetic storage system comprising a magnetic medium and a magnetic reproducing head for reproducing magnetic signals from the magnetic medium, the magnetic reproducing head including a magnetoresistance effect element comprising:
 a metallic layer;
 a first ferromagnetic layer adjacent to the metallic layer;
 a non-magnetic layer disposed on the first ferromagnetic layer;
 a second ferromagnetic layer disposed on the non-magnetic layer so that the non-magnetic layer is disposed between the first and second ferromagnetic layers; and
 an insertion layer inserted between the first ferromagnetic layer and the metallic layer, wherein the insertion layer comprises at least one selected from the group consisting of oxide, nitride, carbide, boride, and fluoride, formed in a continuous state.

43. A magnetic storage system comprising a magnetic medium and a magnetic reproducing head for reproducing magnetic signals from the magnetic medium, the magnetic reproducing head including a magnetoresistance effect element comprising:

a metallic layer;

a first ferromagnetic layer adjacent to the metallic layer;

a non-magnetic layer disposed on the first ferromagnetic layer;

a second ferromagnetic layer disposed on the non-magnetic layer so that the non-magnetic layer is disposed between the first and second ferromagnetic layers; and an insertion layer disposed between the first ferromagnetic layer and the metallic layer, the insertion layer comprising a crystalline material of at least one selected from the group consisting of oxide, nitride, carbide, boride, and fluoride.

44. A magnetic storage system comprising a magnetic medium and a magnetic reproducing head for reproducing magnetic signals from the magnetic medium, the magnetic reproducing head including a magnetoresistance effect element comprising:

a metallic layer;

a non-magnetic layer;

first and second ferromagnetic layers separated by the non-magnetic layer; and an insertion layer of material selected from the group consisting of oxide, nitride, carbide, boride, and fluoride, the insertion layer being inserted between the first ferromagnetic layer and the metallic layer so that the first ferromagnetic layer is disposed between the non-magnetic layer and the insertion layer comprising at least one material selected from the group consisting of oxide, nitride, carbide, boride, and fluoride, the insertion layer having pinholes, wherein the pinholes have an average size equal to or less than the distance between the pinholes adjacent to each other.

45. A magnetic storage system comprising a magnetic medium and a magnetic reproducing head for reproducing magnetic signals from the magnetic medium, the magnetic reproducing head including a magnetoresistance effect element comprising:

a non-magnetic metallic layer;

a first ferromagnetic layer adjacent to the non-magnetic metallic layer;

a non-magnetic layer disposed on the first ferromagnetic layer;

a second ferromagnetic layer disposed on the non-magnetic layer so that the non-magnetic layer is disposed between the first and second ferromagnetic layers; and an insertion layer inserted between the first ferromagnetic layer and the non-magnetic metallic layer, the insertion layer comprising at least one material selected from the group consisting of oxide, nitride, carbide, boride, and fluoride.

* * * * *

UNITED STATES PATENT AND TRADEMARK OFFICE
CERTIFICATE OF CORRECTION

PATENT NO.: 6,111,729

DATED: August 29, 2000

INVENTOR(S): Kamiguchi et al.

It is certified that an error appears in the above-identified patent and that said Letters Patent is hereby corrected as shown below:

\* Claim 1, column 12, line 48, change "ferromagnetic layer" to --ferromagnetic layers--.

Claim 10, column 13, line 10, change "affect element" to --effect element--; and
\*                      line 17, change "ferromagnetic layer" to --ferromagnetic layers--.

Claim 17, column 13, line 50, change "non-magnetic," to --non-magnetic--.

Signed and Sealed this

Twenty-ninth Day of May, 2001

Attest:

NICHOLAS P. GODICI

Attesting Officer        Acting Director of the United States Patent and Trademark Office